United States Patent [19]

Yun-Tae

[11] Patent Number: 4,994,806

[45] Date of Patent: Feb. 19, 1991

[54] FLASH-SUCCESSIVE APPROXIMATION ANALOG-TO-DIGITAL CONVERTER

[75] Inventor: Lee Yun-Tae, Pohang, Rep. of Korea

[73] Assignee: Samsung Electronics Co., Ltd., Kyungki, Rep. of Korea

[21] Appl. No.: 419,003

[22] Filed: Oct. 10, 1989

Related U.S. Application Data

[63] Continuation of Ser. No. 218,462, Jul. 13, 1988, abandoned.

[30] Foreign Application Priority Data

Jul. 22, 1987 [KR] Rep. of Korea ............... 87-7963

[51] Int. Cl.⁵ .................... H03M 1/12; H03M 1/36
[52] U.S. Cl. .................... 341/155; 341/122; 341/159; 341/164
[58] Field of Search ........... 341/122, 155, 156, 162, 341/163, 159, 161, 164

[56] References Cited

U.S. PATENT DOCUMENTS

| | | | |
|---|---|---|---|
| 4,366,469 | 12/1982 | Michaels et al. | 341/139 |
| 4,386,339 | 5/1983 | Henry et al. | 341/159 |
| 4,544,917 | 10/1985 | Lenhoff, Jr. | 341/158 |
| 4,593,270 | 6/1986 | White | 341/163 |
| 4,612,533 | 9/1986 | Evans | 341/156 |
| 4,620,179 | 10/1986 | Cooper et al. | 341/163 |
| 4,639,715 | 1/1987 | Doluca | 341/159 |
| 4,641,129 | 2/1987 | Doluca et al. | 341/156 |
| 4,647,903 | 3/1987 | Ryu | 341/163 |
| 4,749,984 | 6/1988 | Prost et al. | 341/156 |
| 4,763,107 | 8/1988 | Koen et al. | 341/156 |
| 4,777,470 | 10/1988 | Naylor et al. | 341/163 |
| 4,862,171 | 8/1989 | Evans | 341/118 |
| 4,899,153 | 2/1990 | Lewyn | 341/118 |

Primary Examiner—William M. Shoop, Jr.
Assistant Examiner—Helen Kim
Attorney, Agent, or Firm—Cushman, Darby & Cushman

[57] ABSTRACT

This invention relates to a flash-successive approximation analog-to-digital converter combining the low speed, high resolution successive approximation method of conversion with the high speed, low resolution flash method of conversion, which provides the advantages of higher conversion speed with no increased conversion error.

3 Claims, 2 Drawing Sheets

FLASH-SUCCESSIVE APPROXIMATION ANALOG-TO-DIGITAL CONVERTER

This is a continuation of Application Ser. No. 07/218,462, filed July 13, 1988, which was abandoned upon the filing hereof.

BACKGROUND OF THE INVENTION

The present invention relates to a successive approximation analog-to-digital converter, and in particular to a flash-successive approximation analog-to-digital converter for improving conversion speed by using both successive approximation conversion and flash conversion. So far, the conversion speed of analog-to-digital converter (hereinafter referred to ADC) has been reduced by improvement of the processing technique. The processing technique is classified into two classes: the successive approximation method having low speed and high resolution, and the flash method having high speed and low resolution.

An ADC using the successive approximation conversion, as shown in FIG. 1, comprises sample and holder(2), comparator(3), n bit successive approximation register(4) and n bit digital-to-analog converter(5) (hereinafter referred to DAC), and functions as follows.

The analog signal inputted through the input terminal(I) is sampled by sample and holder(2), compared with the signal outputted from n bit DAC(5) and inputted to an n bit successive approximation register (hereinafter referred to as SAR(4)).

The SAR(4) outputs in parallel the digital data corresponding to the reference voltages, and the DAC(5) converts the data into an analog signal. For example, if the SAR(4) outputs the data of "100 ... 0", the n bit DAC(5) outputs the analog signal of Vref/2 (here, Vref is reference voltage) which is then compared with the sampled input signal by comparator(3).

If the sampled analog input signal is greater than Vref/2, the comparator(3) outputs a "1" and the most significant bit(MSB) of the output data of SAR(4) is set to "1". If the sampled analog input signal is less than Vref/2, the comparator outputs a "0" and the most significant bit (MSB) of the output data of SAR(4) is set to "0". In this manner the ADC determines the value of the MSB corresponding to the analog input signal.

Then in order to determine the next most significant bit the SAR(4) outputs "X100 ... 0" (here, X is the pre-determined MSB whose value is set at "1" or "0". If the value of "X" is "1" the n-bit DAC(5) outputs ¾ Vref. If the value of "X" is "0" the n-bit DAC(5) outputs ¼ Vref. Again the output of n-bit DAC(5) is compared with the sampled analog input signal.

In this way, the input analog signal and the analog signal outputted from SAR(4) are compared with each other by comparator(3). If the sampled analog input signal is less than the output of DAC(5) the comparator outputs an "0" and the next most significant bit of the output data of SAR(4) is set to an "0". If the sampled analog input signal is greater than the output of DAC(5), the comparator outputs a "1" and the next significant bit of the output data of SAR(4) is set to a "1".

The SAR(4) will then output a "XX100..." and the process will continue. If the above procedures are repeated to the least significant bit(LSB), the conversion is terminated and the SAR outputs the n-bit digital data corresponding to the input analog signal.

In the above, the number of bits represents the degree of resolution; the more the number of bits becomes, the more precise the converted digital data corresponding to the analog input signal will be.

Such successive approximation results in less error, but the conversion speed is comparatively slow.

FIG. 2 shows a block diagram for explaining a half flash A/D converter, which comprises sample and holder(7), n/2 bit flash A/D converter(8), latch(9), n/2 bit D/A converter(10), subtractor(11) and n/2 bit flash A/D converter(12). At first, the analog signal inputted through the input terminal(6) is sampled by sample and holder(7), and the sampled analog input signal is inputted to n/2 bit flash A/D converter(8). Flash converter (8) comprises $2^{n/2}$ comparators and an encoder, and the upper n/2 bits are determined at once. The digital data corresponding to the upper n/2 bits is latched into n/2 bit DAC(10) by latch (9), and the equivalent analog signal is determined. The analog signal which corresponds to the upper n/2 bits is subtracted from the analog input signal in subtractor(11).

This subtracted signal is further delivered to the other n/2 bit flash A/D converter(12), which determines the remaining lower n/2 bit digital data.

Such a half flash conversion is speedily made, but has a drawback is that a conversion error is generated while determining the lower n/2 bits.

Comparing the conversion time of the successive approximation A/D converter and the half-flash converter, the latter reduces the conversion time by 1 order of magnitude even though the number of bits increases (i.e. the resolution increases), because the number of bits does not affect the conversion time but only increases the number of comparators and encoders.

However, the conversion error is inversely proportional to conversion speed, and the successive approximation A/D converter has less conversion error than the half flash A/D converter.

SUMMARY OF THE INVENTION

The object of the present invention is to provide a flash-successive approximation A/D converter which combines the advantages of the successive approximation A/D converter and the half flash A/D converter so that the conversion speed is faster than the successive approximation while the conversion error remains the same.

DETAILED DESCRIPTION OF THE INVENTION

Hereinafter, an embodiment of the present invention is explained with reference to FIG. 3.

Figure 1:
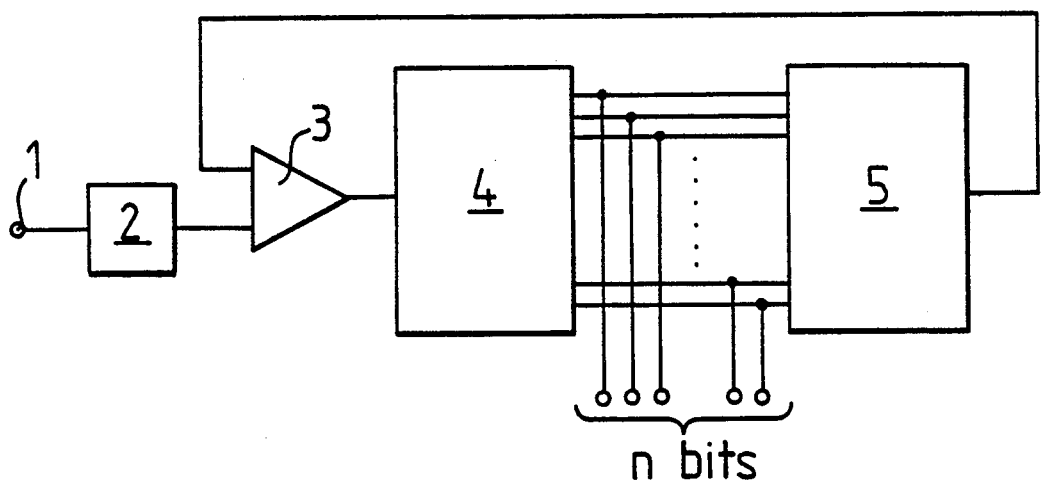
FIG. 1 is a block diagram for showing a prior art successive approximation analog-to-digital converter.
Figure 2:
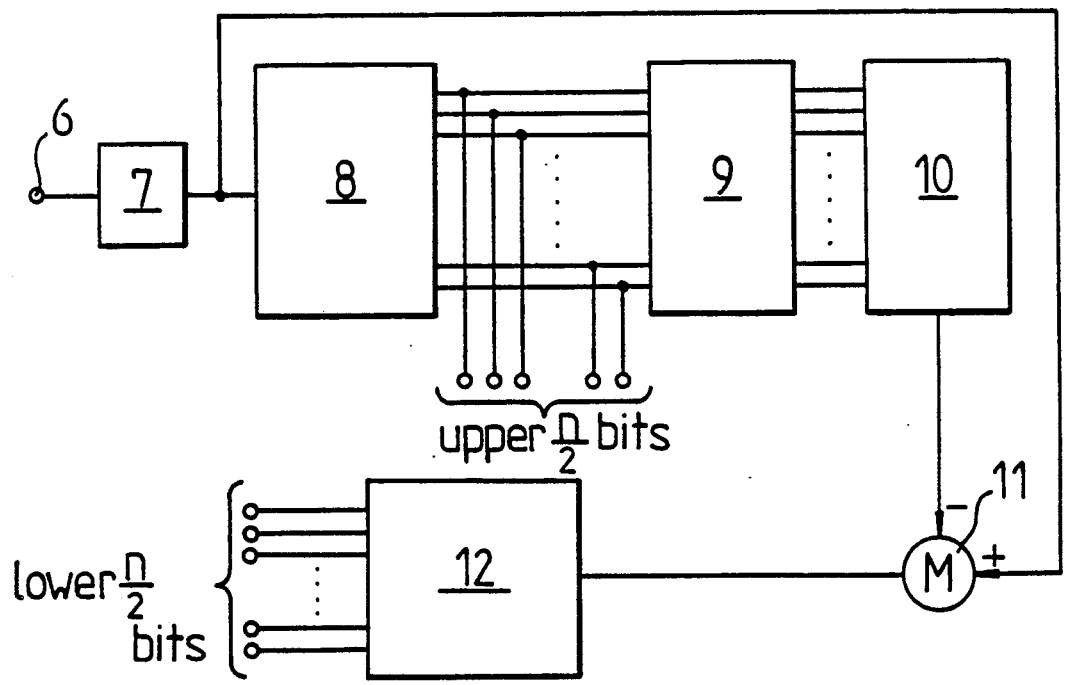
FIG. 2 is a block diagram for showing a prior art half flash analog-to-digital converter.
Figure 3:
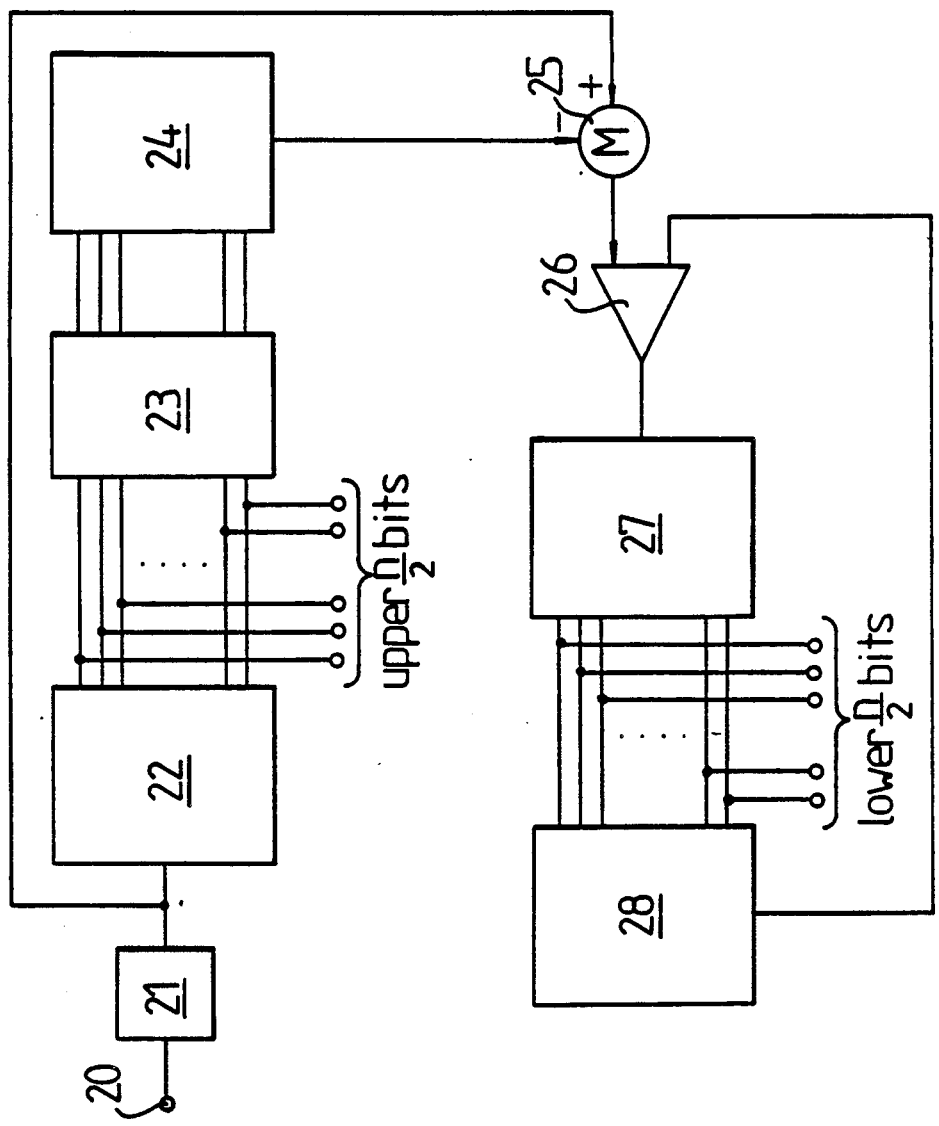
FIG. 3 is a block diagram for showing a flash-successive approximation analog-to-digital converter according to the present invention.

FIG. 3 is a circuit diagram of a flash-successive approximation ADC according to the present invention. A flash conversion circuit (29) is comprised of sample and holder(21), n/2 bit flash converter(22), latch(23), and n/2 bit DAC(24), and subtractor(25), these components are connected respectively for determining the upper n/2 bits, and for outputting an analog signal corresponding to the upper n/2 bits. The analog signal inputted through the input terminal(20) is sampled by sample and holder(21), and is input to n/2 bit flash converter(22) which produces the upper n/2 bit digital data.

The above n/2 bit flash converter(22) comprises n/2 comparators and encoders, wherein the sampled signal is compared simultaneously with the reference voltages delivered by the dividing steps of $2^{n/2}$, the signals resulting from the comparison are delivered to the encoders, outputting the entire upper n/2 bit digital data set.

The upper n/2 bit signals are delivered through latch(23) to the n/2 bit DAC(24), generating an analog signal which corresponds to the upper n/2 bits. A successive approximation conversion circuit (30) includes n/2 bit successive approximation converter (27) and n/2 bit DAC (28), respectively connected for determining the lower n/2 bits. The sampled analog signal is inputted to subtractor (25) and the analog signal corresponding to the upper n/2 bits is subtracted from it, leaving an analog signal corresponding to the lower n/2 bits (V1), which is inputted to comparator (26).

For example, if the n/2 bit successive approximation converter (27) initially outputs data "1000 . . ." to the n/2 bit DAC (28), the DAC (28) outputs the analog signal of Vref/2, which is then compared to V1 by comparator (26). If V1 is greater than Vref/2, the comparator (26) outputs a "1". If V1 is less than Vref/2, the comparator outputs a "0". The comparator (26) output sets the MSB of successive approximation converter (27) to the digital MSB value corresponding to V1. Then in order to determine the next most significant bit, the successive approximation converter (27) outputs "X100 . . ." (where X is the predetermined MSB whose value is set at "1" or "0"). If the value of X is "1" the n/2 bit DAC (28) outputs ¾ Vref. If the value of X is "0" the n/2 bit DAC (28) outputs ¼ Vref. Again the output of the DAC (28) is compared with the analog signal V1. If V1 is less than the output of DAC (28), the comparator outputs a "0" and the next MSB of the output data of successive approximation converter (27) is set to "0". If the analog signal V1 is greater than the output of DAC (28), the comparator outputs a "1" and the next MSB of the output data of successive approximation converter (27) is set to "1". Continuing this process, the n/2 bit successive approximation converter (27) determines sequentially the lower n/2 bit data from MSB to LSB and outputs it. The lower n/2 bit data is coupled with the upper n/2 bit data to yield an n-bit data set corresponding to the original sampled analog signal.

As mentioned hereinbefore, the operational effect of the present invention is first to reduce the conversion speed in comparison to the successive approximation bit ADC, and second to reduce the conversion error in comparison to the flash successive approximation ADC. This is accomplished by determining the upper n/2 bits in a flash conversion and the lower n/2 bits in a successive approximation conversion. Half the process is accomplished with the speed of a flash converter, but the conversion error remains unchanged because the lower n/2 bits (which are most susceptible to conversion error) are determined by successive approximation.

As this invention may be embodied in several forms without departing from the spirit or essential characteristics thereof, the present embodiment is illustrative and should not limit the scope of the invention. All changes that fall within meets and bounds of the claims, or are equivalent to such meets and bounds are intended to be embraced by the claims.

What is claimed is:

1. A flash-successive approximation analog-to-digital converter for inputting an analog input signal and outputting n bits of digital output data which correspond to said analog input signal, comprising:

an n/2 bit flash conversion circuit for sampling said analog input signal and outputting a first digital signal comprising the most significant n/2 bits of said digital output data which correspond to said analog input signal, and a first analog signal comprising an analog voltage level which corresponds to said first digital signal; and an n/2 bit successive approximation conversion circuit for subtracting said first analog signal from said analog input signal, and for outputting a second digital word comprising the least significant n/2 bits of said digital output data which corresponds to said analog input signal.

2. The flash-successive approximation analog-to-digital converter according to claim 1 wherein said n/2 bit flash conversion circuit further comprises, sample and hold means for sampling an analog input signal and for outputting a sampled voltage level;

an n/2 bit flash converter for converting said analog voltage level into said first digital signal comprising the most significant n/2 bits of said digital output data which correspond to said analog input signal;

latch means for latching said first digital signal; and digital-to-analog conversion means for converting said first digital signal into said first analog signal which corresponds to said first digital signal.

3. The flash-successive approximation analog-to-digital converter according to claim 1 or 2 wherein said n/2 bit successive approximation conversion circuit further comprises, subtraction means for subtracting said first analog signal from said sampled voltage level, and for outputting a second analog signal which corresponds to the least significant n/2 bits of said digital output data;

a comparator for comparing said second analog signal with a third analog signal and for outputting a compared signal;

successive approximation conversion means for inputting said compared signal and for outputting a second digital signal comprising the least significant n/2 bits of said digital output data which corresponds to said analog input signal; and digital-to-analog conversion means for inputting said second digital signal and for outputting said third analog signal which corresponds to the least significant n/2 bits of said digital output data.

* * * * *